INVENTORS
Robert H. Wakefield, Jr.
James A. Cunningham
Myint Hswe

BY

WITNESS ATTORNEY

United States Patent Office 3,708,360

Patented Jan. 2, 1973

3,708,360

SELF-ALIGNED GATE FIELD EFFECT TRANSISTOR WITH SCHOTTKY BARRIER DRAIN AND SOURCE

Robert Henry Wakefield, Jr., and James Alan Cunningham, Houston, Tex., and Myint Hswe, Shrewsbury, Mass., assignors to Texas Instruments Incorporated, Dallas, Tex.

Filed June 9, 1970, Ser. No. 44,834
Int. Cl. B23b *31/14*
U.S. Cl. 156—3 5 Claims

ABSTRACT OF THE DISCLOSURE

A low parasitic capacitance field effect transistor is fabricated by the utilization of a self-aligning gate technique. A metal gate is formed and then, employing the gate as a mask, low temperature Schottky barrier source and drain junctions are formed. The technique is particularly useful in the fabrication of the field effect transistor as an element of a large integrated circuit where many such alignments must be made simultaneously.

This invention relates to insulated gate field effect transistors and, more particularly, to a field effect transistor having a self-aligned gate and Schottky barrier source and drain junctions.

Integrated circuits utilizing insulated gate field effect transistors achieve very high packing densities but are limited in their application due to speed limitations. One parameter contributing significantly to the speed limitation is the parasitic gate-to-source and drain capacitance which results largely from the overlap of the gate electrode over the source and drain.

With meticulous care taken in the processing of discrete devices, much of the overlap condition can be eliminated. Such accurate alignment of the gate electrode has been virtually impossible, however, in the fabrication of large integrated circuits where a great number of such transistors are fabricated at the same time.

It is therefore an object of the present invention to provide an insulated gate field effect transistor which is operable at higher frequencies than presently achieved.

Another object of the invention is to provide an insulated gate field effect transistor having minimal gate-to-source and drain parasitic capacitance.

A further object of the invention is to provide an insulated gate field effect transistor structure with an accurately-aligned gate and the method of its manufacture such that the gate is self-aligning.

Still another object of the invention is to provide an insulated gate field effect transistor as above in which the source and drain leakage currents are minimized.

It is still a further object of the invention to provide an insulated gate field effect transistor having Schottky barrier source and drain junctions and a well-aligned gate and to provide such transistor with maximum reverse breakdown voltage.

Yet another object of the invention is to provide each of the above objects in the processing of large as well as small integrated circuits and discrete devices.

An advantage of the present invention is that it utilizes a low-temperature junction process permitting a metal gate electrode to be deposited prior to the formation of source and drain junctions.

These and other objects and advantages are achieved in accordance with the present invention by providing a method of fabricating an insulated gate field effect transistor structure such that the gate is self-aligned. A process of providing Schottky barrier junctions, which is basically a low-temperature process, is utilized to permit the deposition of the metallic gate prior to the formation of the source and drain junctions. After the gate structure has been formed to its desired shape, the source and drain impurity metal is deposited and sintered, employing the gate structure as a mask. The gate thereby becomes self-aligned, eliminating any overlap of the gate over the source and drain junctions and hence eliminating the parasitic gate-to-source and drain capacitance.

Still further objects and advantages of the invention will be apparent from the detailed description and claims and from the accompanying drawings wherein:

Figures 1, 2, 3, 4, 5, 6:
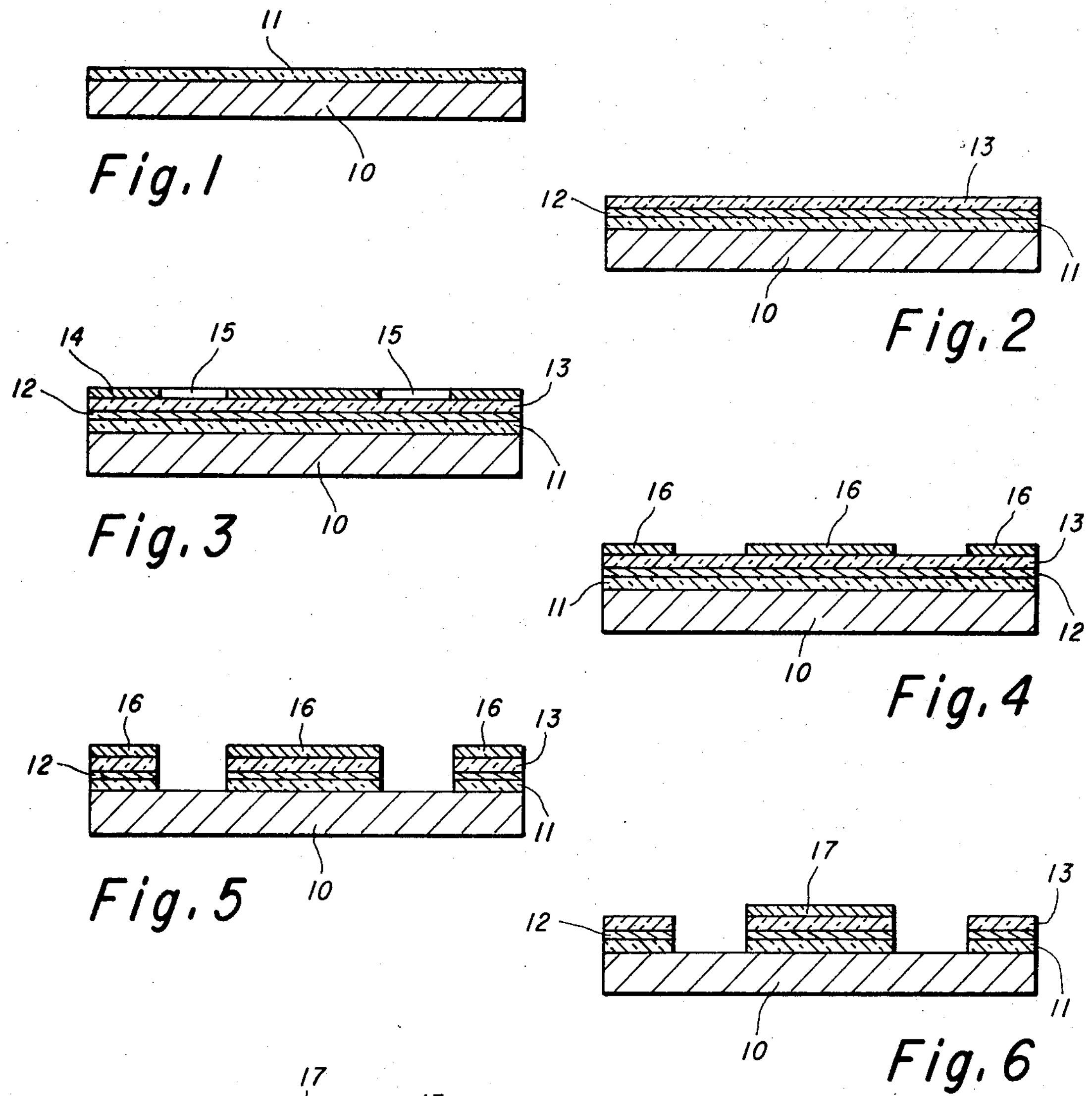
FIGS. 1–9 illustrate the steps in the fabrication of the self-aligning gate field effect transistor of the invention.

Referring now to the drawings, the fabrication of the field effect transistor of the invention, having a self-aligned gate, begins with the growth or deposition of gate insulator layer 11 to a thickness of about 5,000–10,000 angstroms on semiconductor slice 10 as illustrated in FIG. 1. The slice is typically silicon, and silicon dioxide ($SiO_2$), silicon nitride ($Si_3N_4$), aluminum oxide ($Al_2O_3$) or combinations thereof can be used as the insulator material.

Next, as illustrated in FIG. 2, a film 12 of titanium or chromium is deposited over insulating layer 11 to a thickness of about 2,000 angstroms, Metal film 12 is then covered by a second layer 13 of insulating material to a thickness of about 5,000–10,000 angstroms.

A photoresist layer 14 such as KMER is then applied over the surface of insulating layer 13 as illustrated in FIG. 3. The entire surface, except for portions 15 of photoresist layer 14, where source and drain junctions are to be formed, are then selectively exposed to light through a mask.

As illustrated in FIG. 4, unexposed portions 15 are now removed by a solvent such as a xylene and standard solution, leaving unexposed portions 16 and openings exposing insulating layer 13 where the source and drain junctions are to be formed. Such exposed portions of insulating layer 13 are next removed by etching in these areas with a solution of hydrofluoric acid, (HF) as shown in FIG. 5, utilizing portions 16 as a mask. The remainder of insulating layer 13 is then used as a mask to etch those portions of metal layer 12 which were exposed by the removal of portions of layer 13. The etching of metal layer 12 is carried out with an acid solution comprised of sulfuric acid ($H_2SO_4$) and in much smaller quantity, hydrofluoric acid. Finally, the remaining portions 16 of the photoresist and the remaining underlying portions of metal layer 12 serve as masks while the now exposed portions of gate insulator layer 11 are etched with a solution of hydrofluoric acid to expose silicon slice 10 in the source and drain areas.

Now, as illustrated in FIG. 6, the remaining photoresist has been removed by a solution of hot sulfuric or nitric acid or a 70–90% sulfuric acid and 10–30% peroxide solution at room temperature and a water rinse. A new coat of photoresist is then applied and patterned to define a protective layer 17 for the gate area between the source and drain openings plus a small extension projection outwardly from such gate area where contact to the gate can later be made.

Figure 7:
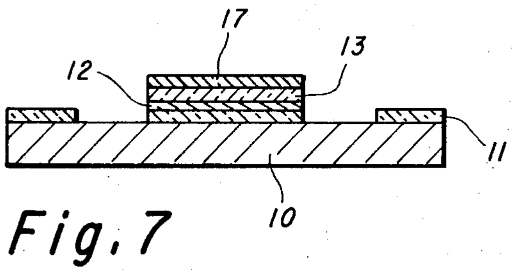

Those portions of insulating layer 13 and metal layer 12, which are unprotected by layer 17, are then removed by etching with the hydrofluoric acid and sulfuric acid solutions, respectively, as illustrated in FIG. 7.

Figure 8:
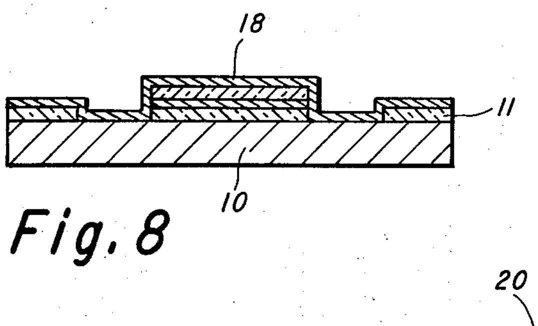

The remaining photoresist, layer 17, is again removed, and as illustrated in FIG. 8, a thin film 18 of platinum, approximately 1,000 angstroms thick, is deposited on the slice. The slice is then heated to a temperature of between 600–650° C., which is low enough to prevent any damage to metal layer 12, but which is sufficient to cause that portion of platinum film 18 which is in contact with silicon slice 10 to react in the source and drain areas. More particularly, the reaction forms platinum silicide, thereby creating metal-semiconductor junctions 19 commonly known as Schottky barrier junctions. Junctions 19 then serve as the source and drain junctions of the field effect transistor.

After formation of the platinum silicide, the remaining unreacted portion of platinum layer 18 is etched from the surface of the slice with an aqua regia solution. Gate metal layer 12, being insoluble in aqua regia, is not attacked during this process.

Figure 9:
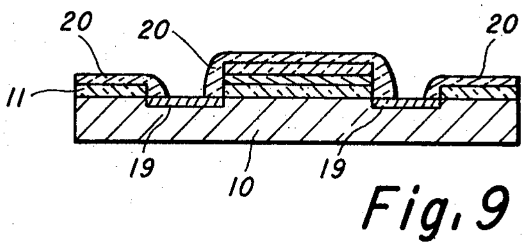

A new layer 20 of insulating material is deposited over the slice and openings made to expose portions of platinum silicide junctions 19 and the portion of metal layer 12 forming the small extension projecting from the gate area, as illustrated in FIG. 9.

Another metal film 21, such as aluminum, is finally selectively deposited and expanded contacts or interconnections for an integrated circuit formed therefrom by conventional techniques. The completed field effect transistor structure is then as shown in FIG. 10.

When the field effect transistor structure is used in an integrated circuit, the standard thick oxide technique can be utilized to avoid surface inversion beneath the metal interconnects. This is accomplished by first growing the thick oxide and then etching "islands" down to the silicon slice. The fabrication process, as described above, begins from there. In addition, where diffused interconnects are desirable, in particular integrated circuit embodiments employing the field effect transistor of the invention, they can also be implanted by conventional techniques before the fabrication process described above is begun.

Figure 10:
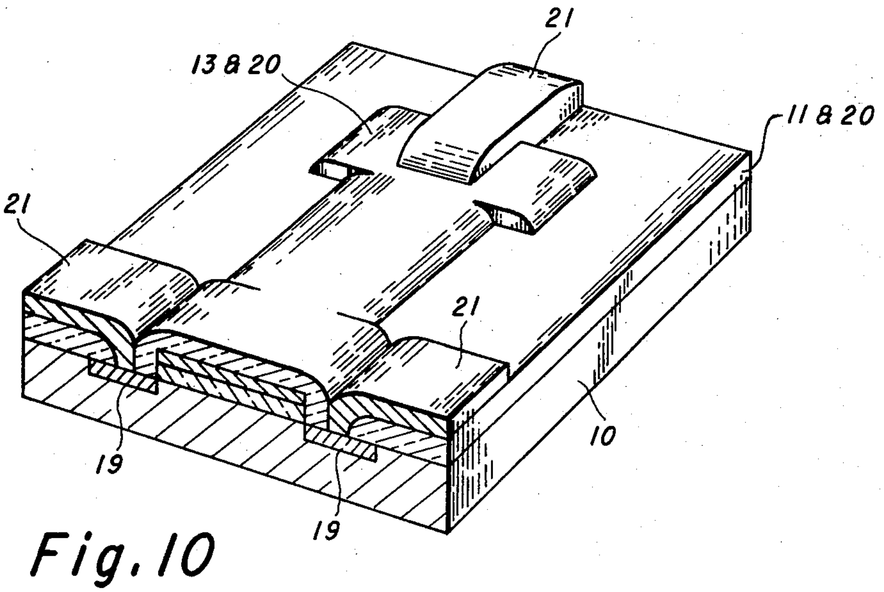
FIG. 10 illustrates the completed field effect transistor structure having a self-aligned gate and Schottky barrier diode source and drain junctions.
Figure 11:
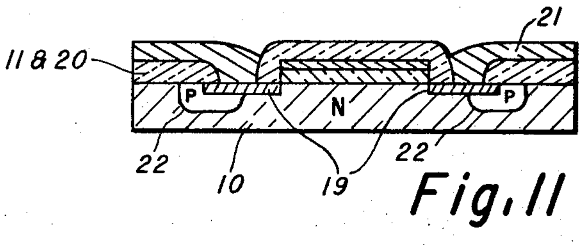
FIG. 11 illustrates a modification of the basic structure shown in FIG. 10 to incorporate a guard ring to reduce the leakage currents between the source and drain junctions and the substrate.

In one embodiment of the invention, a guard ring 22 is incorporated in the basic structure of FIG. 10 to reduce the leakage currents between source and drain junctions 19 and substrate 10, as illustrated in FIG. 11. Guard ring 22 is formed by diffusing a layer of opposite conductivity type material into silicon substrate 10 prior to the formation of the platinum silicide junctions. The structure illustrated is an N-channel device.

Figure 12:
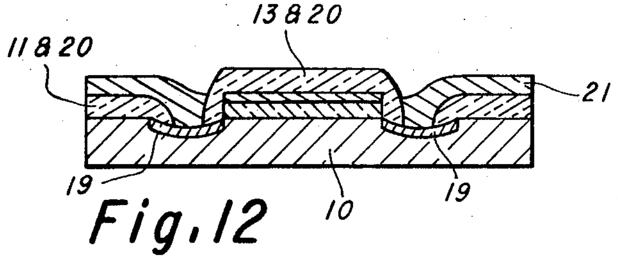
FIG. 12 illustrates an additional modification of the basic structure to increase the reverse breakdown voltage of the source and drain junctions.

In another embodiment, the breakdown voltages of the source and drain junctions are increased by eliminating the sharp junction curvatures near the surface. In this embodiment an rf sputter etch is performed after the source and drain windows have been formed to expose the surface of the silicon slice. The sputter etch creates shallow valleys in the silicon, and when the platinum is deposited and sintered, platinum silicide junctions 19 will be as shown in FIG. 12.

The description of specific embodiments contained herein are merely illustrative of the principles underlying the inventive concept. Without departing from the spirit and scope of the invention, various modifications of the disclosed embodiments, as well as other embodiments of the invention, will be apparent to those persons skilled in the art.

We claim:

1. A method for fabricating an insulated-gate-field effect transistor comprising the steps of:

(a) forming a relatively thin insulating layer over one surface of a semiconductor substrate;

(b) forming a first metal layer over said insulating layer;

(c) selectively etching said composite to expose spaced apart surface regions of said substrate, the portion of said first metal layer intermediate said spaced regions defining the gate electrode of an insulated-gate-field effect transistor;

(d) forming a second metal layer having different etch characteristics than said first metal layer over said substrate and layers thereon;

(e) sintering that portion of said second metal layer contacting said exposed regions to produce a reaction between said second metal and said exposed semiconductor effective to create a Schottky barrier junction therebetween the remaining portion of said second metal being substantially unaffected by said sintering; and (f) etching said second metal layer to remove said remaining portions thereof, said first metal layer providing an etch stop, thereby effecting gate-aligned source and drain contacts.

2. A process as set forth in claim 1 wherein said first metal layer is selected from the group consisting of titanium and chromium.

3. A process as set forth in claim 2 wherein said second metal is platinum.

4. A process as set forth in claim 1 including the step of forming a region of opposite conductivity type in said substrate surrounding said spaced regions and the portion of said substrate therebetween to define a guard ring.

5. A process as set forth in claim 1 including the step of sputter etching said exposed spaced apart surface regions of said substrate prior to depositing said second layer of metal.

References Cited

UNITED STATES PATENTS

| | | | |
|---|---|---|---|
| 3,472,712 | 10/1969 | Bower | 29—578 |
| 3,551,221 | 12/1970 | Yanagawa | 29—578 |
| 3,590,471 | 7/1971 | Lepselter | 29—571 |

OTHER REFERENCES

Ames, IBM Technical Bulletin, vol. 9, No. 10, March 1967, pp. 1470–1471, "Field Effect Transistors Utilizing Schottky."

CHARLES W. LANHAM, Primary Examiner

W. TUPMAN, Assistant Examiner

U.S. Cl. X.R.

156—17; 29—578, 571